US006911730B1

(12) United States Patent
New

(10) Patent No.: US 6,911,730 B1
(45) Date of Patent: Jun. 28, 2005

(54) MULTI-CHIP MODULE INCLUDING EMBEDDED TRANSISTORS WITHIN THE SUBSTRATE

(75) Inventor: Bernard J. New, Carmel Valley, CA (US)

(73) Assignee: Xilinx, Inc., San Jose, CA (US)

( * ) Notice: Subject to any disclaimer, the term of this patent is extended or adjusted under 35 U.S.C. 154(b) by 59 days.

(21) Appl. No.: 10/379,196

(22) Filed: Mar. 3, 2003

(51) Int. Cl.$^7$ .......................... H01L 23/34; H01L 23/48; H01L 23/52; H01L 29/40
(52) U.S. Cl. .................. 257/724; 257/723; 257/777
(58) Field of Search ................................ 257/723–724, 257/777–778, 685–686

(56) References Cited

U.S. PATENT DOCUMENTS

| | | | |
|---|---|---|---|
| 4,458,297 A | | 7/1984 | Stopper et al. |
| 5,264,664 A | | 11/1993 | McAllister et al. |
| 5,377,124 A | | 12/1994 | Mohsen |
| 5,490,042 A | | 2/1996 | Perkins |
| 5,532,519 A | | 7/1996 | Bertin et al. |
| 5,572,409 A | | 11/1996 | Nathan et al. |
| 5,622,770 A | | 4/1997 | Dowdy et al. |
| 5,642,262 A | | 6/1997 | Terrill et al. |
| 5,661,409 A | | 8/1997 | Mohsen |
| 5,990,564 A | * | 11/1999 | Degani et al. ............... 257/778 |
| 6,040,985 A | | 3/2000 | Arai et al. |
| 6,054,767 A | | 4/2000 | Chia et al. |
| 6,114,221 A | | 9/2000 | Tonti et al. |
| 6,271,059 B1 | | 8/2001 | Bertin et al. |
| 6,521,994 B1 | * | 2/2003 | Huse et al. ................. 257/724 |
| 6,737,743 B2 | * | 5/2004 | Urakawa .................... 257/724 |

OTHER PUBLICATIONS

Xilinx, Inc.; "The Programmable Logic Data Book 1999"; published Mar. 1999; available from Xilinx, Inc., 2100 Logic Drive, San Jose, California 95124; pp. 5–16 through 5–17 and 6–45 through 6–68.

\* cited by examiner

Primary Examiner—Cuong Nguyen
(74) Attorney, Agent, or Firm—Lois D. Cartier

(57) ABSTRACT

The invention provides multi-chip modules (MCMs) that utilize transistors embedded in an active substrate to provide various desirable functions, optionally including programmable functions. In some embodiments, the MCM includes an active substrate having a field-programmable universal structure. The active substrate includes a regular grid pattern of lands separated by a programmable interconnect structure similar to those used in field programmable gate arrays (FPGAs). Interconnections within the programmable interconnect structure are controlled by values stored in configuration memory cells. The regular pattern of lands on the surface of the substrate permits the use of a single programmable active substrate to mount die of various sizes by means of solder bumps positioned to correspond to the land grid on the active substrate. The re-programmable nature of the interconnections within the substrate provide for the initial interconnections of the variously-sized die as well as providing for later alterations in the MCM design.

33 Claims, 8 Drawing Sheets

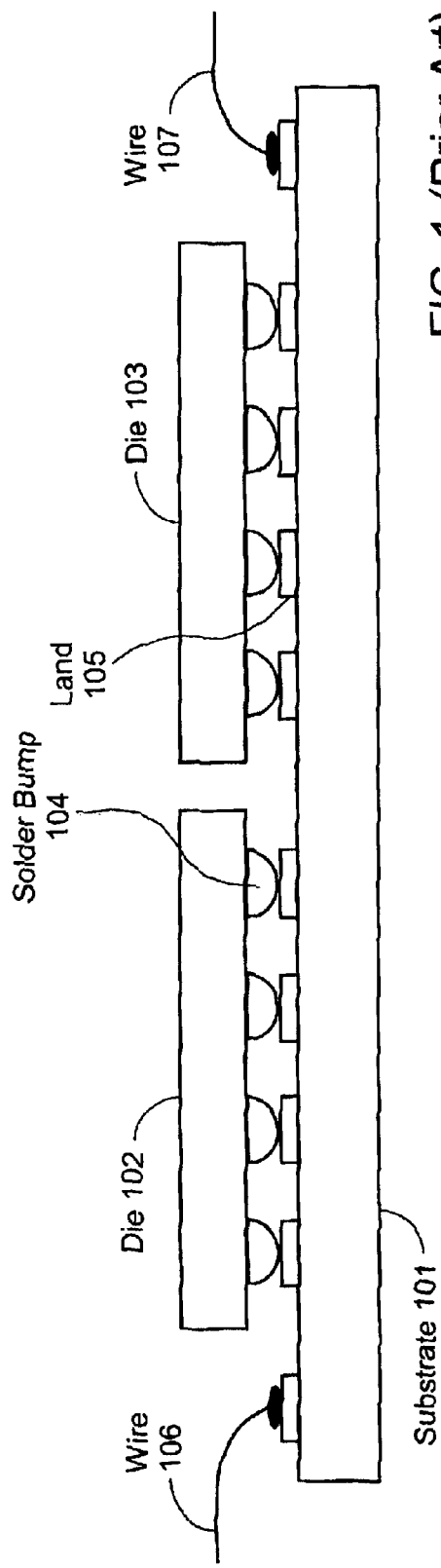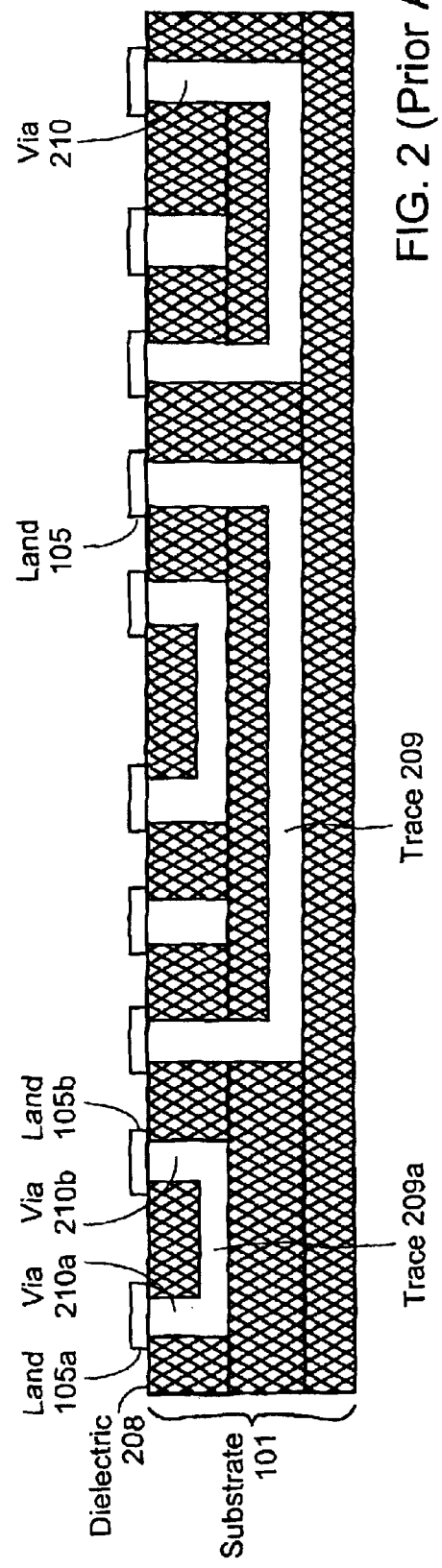

MULTI-CHIP MODULE INCLUDING EMBEDDED TRANSISTORS WITHIN THE SUBSTRATE

FIELD OF THE INVENTION

The invention relates to Multi-Chip Modules (MCMs). More particularly, the invention relates to an MCM that utilizes transistors embedded in an active substrate to provide various desirable functions, optionally including programmable functions.

BACKGROUND OF THE INVENTION

There is strong market pressure to reduce the cost of integrated circuits (ICs). These cost considerations are causing IC manufacturers to use smaller feature sizes within the ICs, which permits a greater density of features on the die. As a result, the likelihood is increasing that a given manufacturing defect will impinge on one of these features and produce a malfunctioning IC.

At the same time, there is strong motivation to provide ever more functionality, and thus to include larger and larger numbers of transistors in an IC, resulting in a larger die. All else being equal, the likelihood of a manufacturing defect occurring on a die increases rapidly as the die area increases. Thus, a larger die size means a much greater probability of a manufacturing defect affecting each die.

One well-known method of addressing these limitations is to manufacture several smaller dice and incorporate them together into a single packaged product known as a "multi-chip module", or MCM. Because several smaller dice are used, each die has a much lower probability of including a manufacturing defect. Further, each die can be at least minimally tested prior to inclusion in the MCM, which further increases the final product yield. Using an MCM also allows the combination of several die from different sources.

An MCM includes a substrate, commonly made of a ceramic material, on which are mounted two or more dice, flipped so that the input/output (I/O) pads of the die can be coupled to lands on the substrate. The combined substrate and dice are then packaged in a fashion similar to that used to package single ICs.

FIG. 1 shows a side view of an MCM that includes a substrate 101 and two IC dice 102, 103. Solder bumps 104 couple the die I/O pads to the substrate 101 via substrate lands 105. Substrate 101 includes metallic interconnect lines (not shown in FIG. 1) that interconnect some of the lands 105 according to a predetermined pattern, thus coupling the I/O pads of the dice to each other. Others of the substrate lands are coupled to package pins of the MCM package using well-known techniques such as wire bonding via wires 106, 107.

FIG. 2 shows a cutaway view of substrate 101 of FIG. 1 and its associated lands. Substrate 101 is a layered construct manufactured using techniques similar to those used to manufacture printed circuit boards (PCBs). Layers of dielectric material 208 (shown cross-hatched in FIG. 1) isolate metallic traces 209 from each other. Conductive vias 210 perpendicular to the surface of the substrate interconnect the lands 105 with the conductive traces 209.

By laying out the conductive traces in a predetermined fashion, the desired interconnections are implemented among the die I/O pads and between the die I/O pads and the MCM package pins. For example, in the MCM substrate 101 shown in FIGS. 1 and 2, land 105a is coupled through a bonding wire 106 to a package pin, and also coupled through via 210a, trace 209a, and via 210b to land 105b. Note that, as in a PCB layout, the interconnections between the various die I/O pads are fixed and cannot be changed without retooling and manufacturing a new substrate 101.

This inflexibility has been addressed in various ways. For example, a type of programmability has been provided by "programming" the substrate using wire bonding, or by cutting traces and using jumpers to make the new connections. Another known method of providing flexibility is to use a dual-sided substrate that carries multiple prepackaged PLDs on a top side and a field programmable interconnect (FPIC) die on a bottom side. Thus, programmable connections are provided within the FPIC die, and not by the substrate itself.

It has also been proposed that programmable junctions be provided between metal traces, the junctions comprising amorphous silicon antifuses that are normally insulators, but are selectively programmable after the substrate is manufactured by applying a voltage pulse across the antifuse to render it conductive. The drawback to this technique is that the programming of the substrate is irreversible.

While some degree of flexibility is provided by these techniques, known MCMs either lack the ability to alter the interconnect pattern after programming, or require additional dice to provide the programming capability. Therefore, it is desirable to provide an MCM that offers a heightened degree of flexibility without requiring that additional die be added to the MCM.

Further, when known MCM substrates are used, all electrical functions are performed within the IC dice mounted to the MCM substrate. For example, as MCMs increase in size, the MCM can become large enough to make buffering of signals on long traces a desirable feature. Using known MCM substrates, any such buffers are implemented either within one of the dice already included in the MCM or by adding another die to perform the buffering function. Therefore, it is desirable to provide an MCM substrate that can perform common electrical functions without using these resources.

SUMMARY OF THE INVENTION

The invention provides multi-chip modules (MCMs) that utilize transistors embedded in an active substrate to provide various desirable functions, optionally including programmable functions. An MCM substrate including embedded transistors is referred to herein as an "active" substrate.

In some embodiments, the MCM includes an active substrate having a field-programmable universal structure. In these embodiments, the active substrate includes a regular grid pattern of lands separated by a programmable interconnect structure. The regular pattern of lands on the surface of the substrate permits the use of a single programmable active substrate to mount dice of various sizes by means of terminals positioned to correspond to the land grid on the active substrate. The re-programmable nature of the interconnections within the substrate provides for the initial interconnections of the variously-sized dice as well as providing for later alterations in the MCM design.

In some embodiments, the programmable interconnect structure is similar to those used in Field Programmable Gate Arrays (FPGAs). In these embodiments, interconnections within the programmable interconnect structure are controlled by values stored in configuration memory cells. The configuration memory cells can be configured, for example, from a programmable read only memory (PROM)

die mounted on the active substrate. The configuration can be performed, for example, using known techniques currently used for configuring FPGAs. In other embodiments, the programmable interconnect structure is similar to the interconnect structures included in Complex Programmable Logic Devices (CPLDs). In these embodiments, interconnections within the programmable interconnect structure are controlled by values stored in EEPROM memory cells.

In other embodiments, the MCM includes an active substrate customized to the particular MCM design. In these embodiments, the active substrate includes lands, interconnect lines, and active areas including transistors embedded within the substrate. The transistors are custom-designed to provide the desired functionality. The interconnect lines are coupled between and among the lands and the transistors, and are custom-designed to provide the desired interconnections therebetween.

In yet other embodiments, the MCM includes an active substrate having a mask-programmable universal structure. In these embodiments, the active substrate includes a regular grid pattern of lands separated by a mask-programmable interconnect structure similar to those commonly used in Application Specific Integrated Circuits (ASICs). Also included in the substrate is a regular pattern of transistors implementing a desired logic function, e.g., buffers. Using mask programming, these transistors are accessible to interconnect lines within the interconnect structure.

According to a first aspect of the invention, an MCM includes an active substrate having a plurality of lands disposed on a first surface, and two integrated circuit (IC) dice. A first subset of the lands are "external lands", i.e., lands designated to receive and/or provide signals external to the MCM, while a second subset of the lands are directly coupled to terminals of the IC dice. The active substrate includes a programmable interconnect structure comprising a plurality of interconnect lines and a plurality of programmable interconnect points (PIPS) coupled to the interconnect lines. A plurality of the interconnect lines are programmably connectable to the lands through a plurality of the PIPs. The active substrate also includes configuration memory cells, each configuration memory cell being coupled to one of the PIPS.

According to a second aspect of the invention, an MCM includes an active substrate having a plurality of lands disposed on a first surface, and two IC dice. A first subset of the lands are external lands, while a second subset of the lands are directly coupled to terminals of the IC dice. The active substrate includes an interconnect structure coupled to at least a portion of the lands and comprising a plurality of fixed interconnect lines. The active substrate also includes a plurality of active areas coupled to the interconnect structure and including transistors embedded within the active substrate.

According to a third aspect of the invention, an MCM includes a mask-programmable active substrate having a plurality of lands disposed on a first surface, and two IC dice. A first subset of the lands are external lands, while a second subset of the lands are directly coupled to terminals of the IC dice. The active substrate includes a mask-programmable interconnect structure coupled to at least a portion of the lands and comprising a plurality of mask-programmed interconnect lines. The active substrate also includes a plurality of active areas distributed in a second regular grid pattern corresponding to the first regular grid pattern, each active area including similar transistors embedded within the active substrate, at least one of the active areas being mask-programmably coupled to the interconnect structure.

BRIEF DESCRIPTION OF THE DRAWINGS

The present invention is illustrated by way of example, and not by way of limitation, in the following figures.

FIG. 1 is a side view of a known multi-chip module (MCM) including two IC dice mounted on an MCM substrate.

FIG. 2 is a cutaway view of the MCM of FIG. 1.

DETAILED DESCRIPTION OF THE DRAWINGS

In the following description, numerous specific details are set forth to provide a more thorough understanding of the present invention. However, it will be apparent to one skilled in the art that the present invention can be practiced without these specific details.

Figure 3:
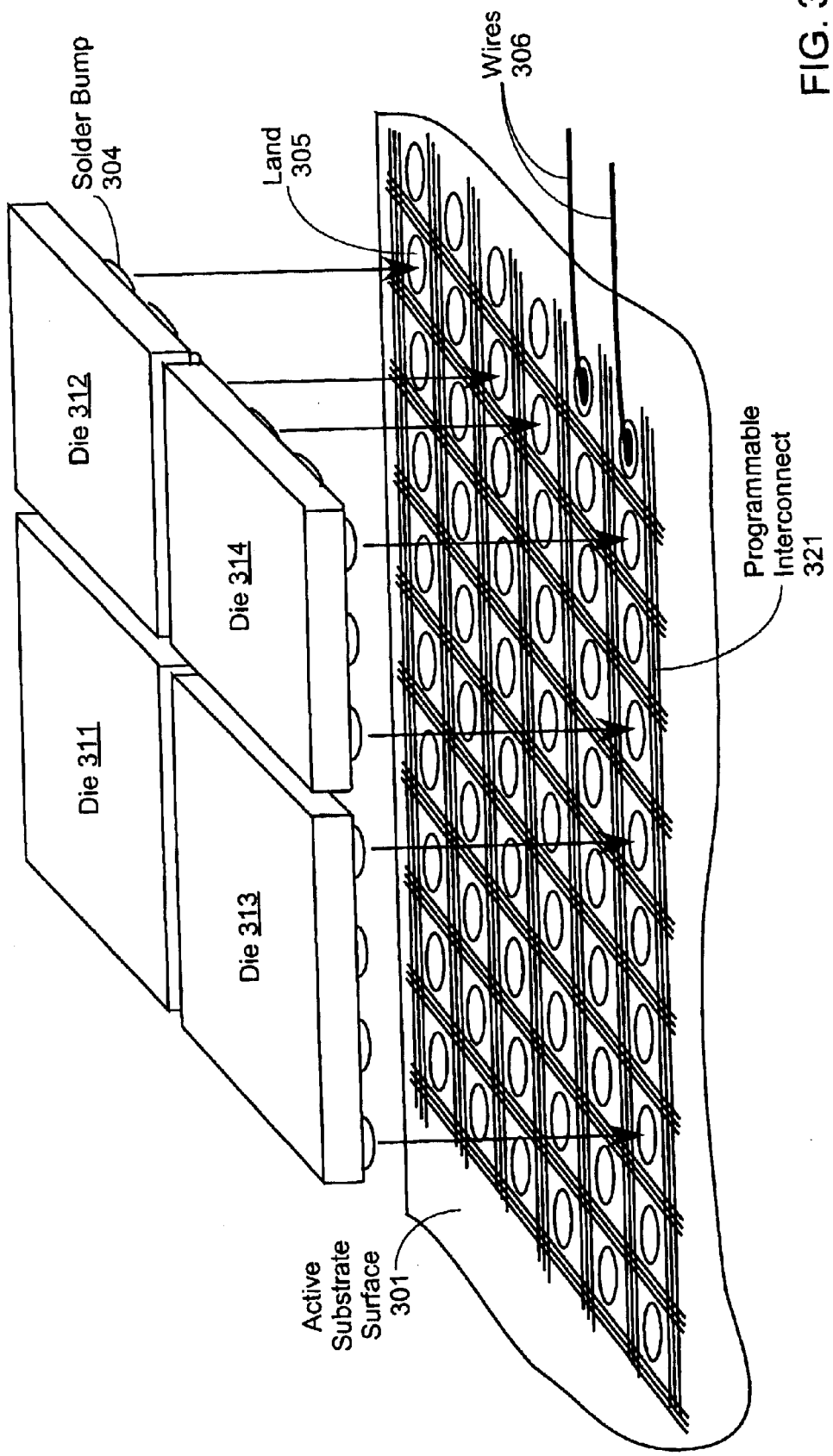
FIG. 3 is a perspective view of an MCM including an active substrate with a programmable interconnect structure, according to an embodiment of the invention.

FIG. 3 provides a perspective view of an MCM including an active substrate with a programmable interconnect structure, according to one embodiment of the invention. The MCM of FIG. 3 includes an active substrate 301, of which only the top surface is shown. The active substrate includes a large number of lands 305 arranged in a regular grid pattern. Although a rectangular grid is shown in FIG. 3, many other regular patterns can be used, e.g., diamond-shaped, hexagonal, or octagonal grids. The purpose of the regular grid pattern is to permit IC die of various footprints to be placed onto the land grid. (The term "footprint" as used herein denotes the size and shape of an IC die as viewed from above or below.) Preferably, IC dice are used that have terminals (e.g., solder bumps) arranged in a regular pattern that matches the pattern of the lands on the substrate. If necessary, an existing IC die can be converted to the desired regular pattern using additional processing steps, using techniques that are well known in the relevant arts (e.g., adding solder bumps).

Interspersed with the lands 305 is a programmable interconnect structure 321. As is later shown and described in connection with FIGS. 4–7, for example, programmable interconnect structure 321 includes programmable interconnections with the lands 305. Thus, programmable interconnect structure 321 can be used to make interconnections between the lands 305.

A subset of the lands are bonded using conventional techniques (e.g., using wires 306) to package pins of the MCM package (not shown). Because the substrate is active, it includes transistors that function using power and ground. Thus, some of the lands are coupled to MCM package pins that provide power and ground to the active substrate.

Mounted on the surface of the active substrate 301 are dice 311–314. Dice 311–314 can be mounted on the active surface using flip-chip techniques, for example, which are well known in the art of MCM manufacture. Disposed on the bottom surface of dice 311–314 are IC terminals 304 arranged in the same regular pattern as the lands 305 on the surface of the substrate 301. Because the patterns of the lands and the IC terminals are the same, the IC dice can be mounted virtually anywhere on the substrate surface, and dice of different sizes can be mounted on the same substrate without customizing the substrate to accommodate the different dice. In other embodiments, the patterns of the lands and the IC terminals are not the same. For example, the substrate can include more lands than are required to make contact with each of the IC terminals.

The IC dice 311–314 also need access to power and ground, which is preferably provided without traversing any of the PIPs. Thus, some of the lands 305 are power and ground lands that are coupled to power and ground through fixed interconnect lines included in active substrate 301. The power and ground lands provide the power and ground to power and ground terminals of the IC dice.

Some embodiments use the active areas of the MCM substrate to provide programmable voltage regulators for at least some of the power lands. These programmable voltage regulators are coupled to the power supply (or supplies), and can provide various voltage levels to die designed to function at those levels.

Some embodiments provide decoupling capacitors between the power supply (or supplies) and ground. In some embodiments, the MCM includes a capacitor device (not shown) mounted on the substrate and coupled between the power and ground lands of the substrate.

In the embodiment of FIG. 3, the IC terminals are implemented as solder bumps, the manufacture and use of which are well known in the art. However, other implementations can be used. For example, in U.S. Pat. No. 6,271,059 B1, Bertin et al. describe the manufacture and use of stub terminals in providing interconnections between an IC and a substrate. In U.S. Pat. No. 6,114,221, Tonti et al. describe the manufacture of protrusions and recesses of complementary shapes, and similar techniques could be used to provide lands and terminals of complementary shapes. These two patents are hereby incorporated herein by reference. Either of these methods, or many other methods, both known and yet to be invented, can be used to manufacture the lands and terminals of the invention.

Note that in the embodiment of FIG. 3, the dice are not all of the same shape and size. For example, dice 311 and 313 include a 3×4 array of terminals on the lower surface, while dice 312 and 314 each include a 3×3 array. While actual dice typically include much larger numbers of terminals, it is clear that the use of a regular grid pattern of lands 305 on substrate 301 enables the mounting on the substrate 301 of dice 311–314 having different footprints.

Figure 4:
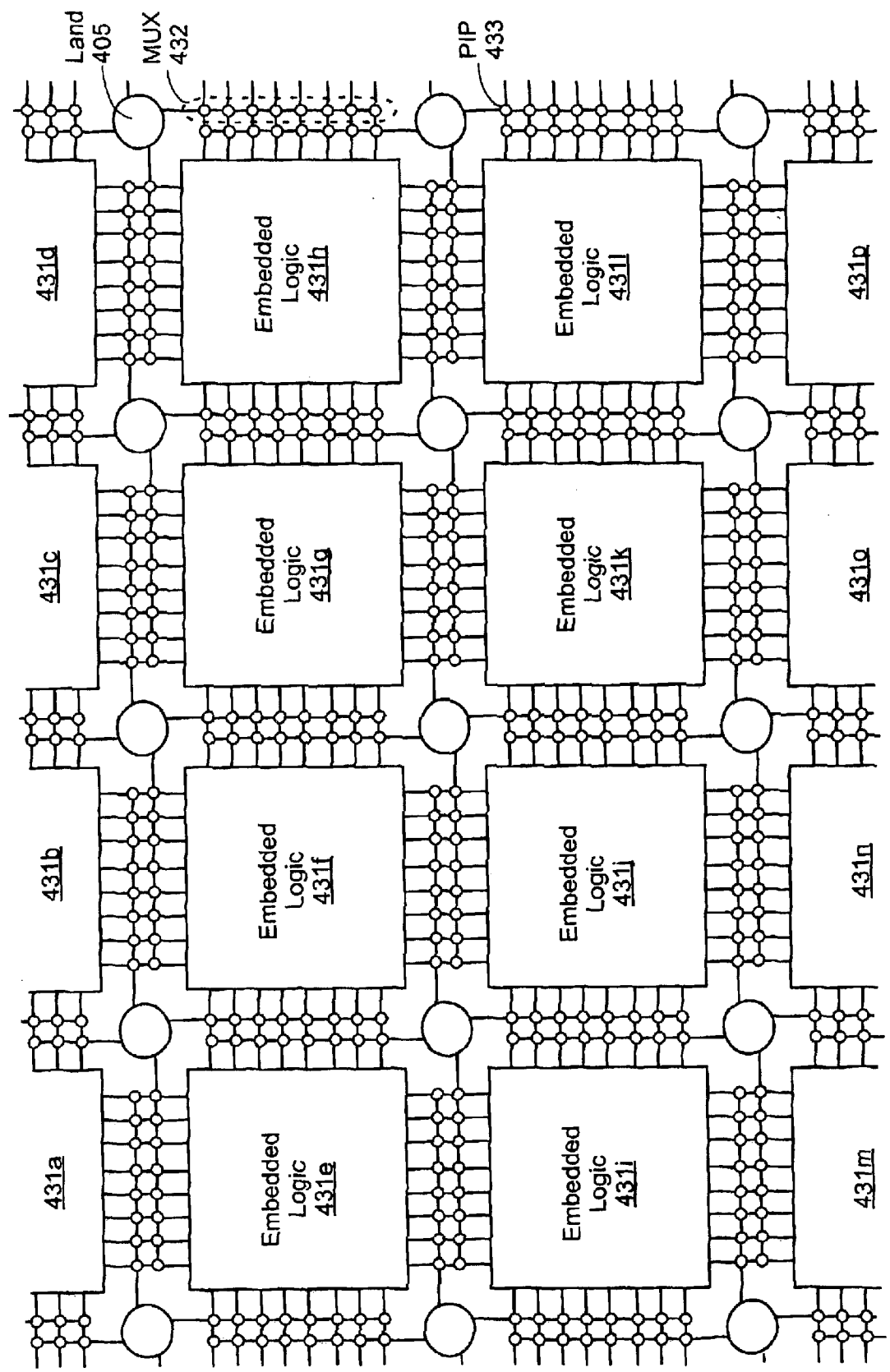
FIG. 4 shows the surface of an active substrate having a programmable interconnect structure according to an embodiment of the invention.

FIG. 4 illustrates an active substrate according to one embodiment of the invention, in which the programmable interconnect structure is similar to those used in Field Programmable Gate Arrays (FPGAs). Only a portion of the substrate surface is illustrated. In the embodiment of FIG. 4, the programmable interconnect structure includes blocks of embedded logic 431 interspersed among the lands 405. Embedded logic blocks 431 are programmably coupled to each other and to the lands through programmable interconnect points (PIPs) 433. In the pictured embodiment, where a regular pattern of features is maintained across the surface of the substrate, the logic within each embedded logic block 431a–431p is the same. In other embodiments, the logic differs between the different logic blocks.

Clearly, to manufacture the logic in embedded logic blocks 431, a simple ceramic substrate layered with metal (see FIG. 2) is not sufficient. Instead, the substrate is preferably manufactured using techniques and materials similar to those used in manufacturing integrated circuits. To provide structural strength, however, an additional substrate can be used to support the active semiconductor substrate.

Figure 5:
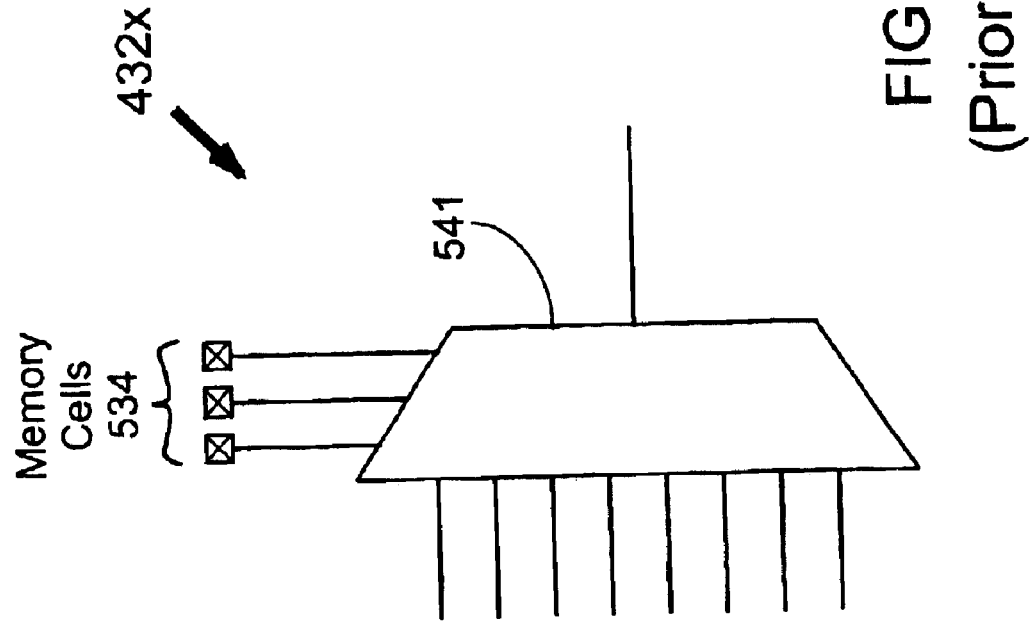
FIG. 5 shows a multiplexer structure that can be used with the embodiment of FIG. 4.

FIG. 4 shows a group of eight PIPs that together form a multiplexer (MUX) 432. This type of structure is often used in FPGAs. FIG. 5 shows an encoded 8-to-1 multiplexer 432x controlled by three memory cells 534 that can be used as MUX 432. However, any MUX implementation can be used. For example, an equivalent non-encoded multiplexer would be controlled by eight memory cells. However, the provision of eight input signals to the multiplexer is merely illustrative, and there may be many more (or fewer) than eight input signals.

Figure 6:
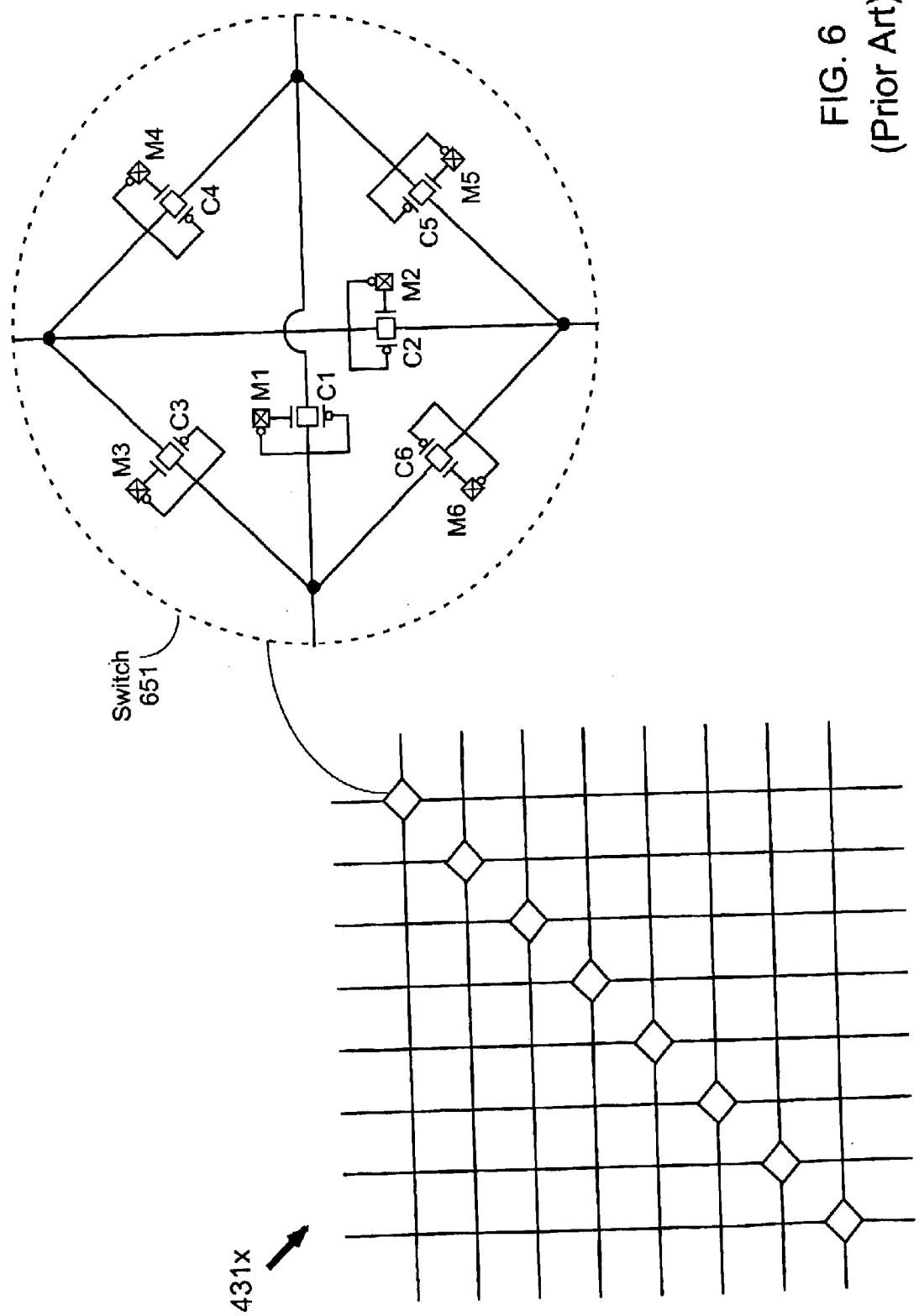
FIG. 6 shows a first exemplary programmable interconnect point (PIP) that can be used with the embodiment of FIG. 4.

Returning now to FIG. 4, embedded logic blocks 431 can include, for example, programmable switch matrices similar to those included in FPGAs. For example, FIG. 6 illustrates a programmable switch matrix 431x that can be used to implement embedded logic 431a–431p. In FIG. 6, a diamond-shaped object placed at the intersection of two interconnect lines indicates the presence of a switch between the two lines. The switch can be implemented, for example, in a fashion similar to switch 651 shown in FIG. 6. Switch 651 has four terminals, and includes a pass transistor C1–C6 between each pair of the terminals. Each pass transistor C1–C6 is controlled by a memory cell M1–M6. Switch 651 can also be used to implement multiplexer 432 in FIG. 4.

Figure 7:
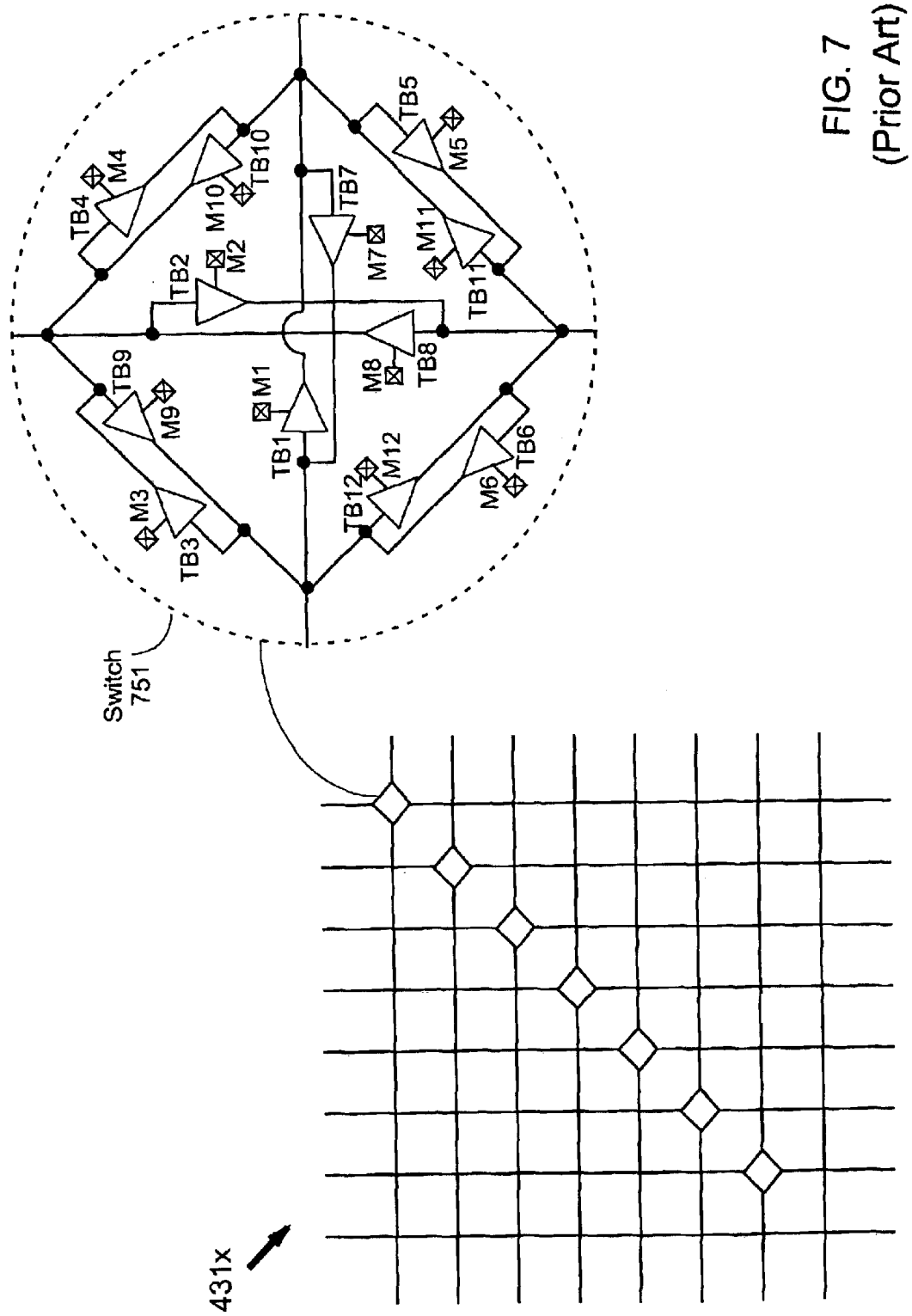
FIG. 7 shows a second exemplary PIP that can be used with the embodiment of FIG. 4.

FIG. 7 shows another switch 751 that can be used in switch matrix 431x. Switch 751 is similar to switch 651, but the pass transistors are replaced by tristate buffers TB1–TB12 controlled by memory cells M1–M12. Note that in the embodiment of FIG. 7, switch matrix 431x includes one horizontal line and one vertical line that bypass the switches 751 to provide faster interconnect lines between non-adjacent switch matrices where these lines connect to switches. In the switch matrices where these lines do connect, other interconnect lines bypass the switch matrix. Of course, many other implementations of switch matrix 431x are possible.

Further, many types of circuits other than switch matrices can be used to implement embedded logic blocks 431. For example, embedded logic blocks 431 can include level shifters, which allows the MCM to include IC dice operating at different power high (VDD) levels.

As previously described, configuration data is loaded into the configuration memory cells to render the interconnections in the substrate operational. This capability can be added to the MCM in various ways.

For example, in some embodiments where the configuration memory cells are static RAM cells, the active substrate includes configuration logic similar to that used in FPGAs. For example, configuration logic can be used that is similar to that included in the FPGAs available from Xilinx, Inc. Exemplary FPGA configuration is described in pages 6-45 through 6-68 of the Xilinx 1999 Data Book entitled "The Programmable Logic Data Book 1999" (hereinafter referred to as "the Xilinx 1999 Data Book"), published March, 1999, and available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.)

The configuration logic is non-programmably coupled to the static RAM cells. In some embodiments, a programmable read only memory (PROM) die is coupled to the substrate through a set of lands that are non-programmably connected to the configuration logic. The PROM die stores the configuration data for the programmable interconnect structure.

In some embodiments, the configuration memory cells are EPROM cells similar, for example, to those used in Complex Programmable Logic Devices (CPLDs). In some such embodiments, the active substrate includes configuration logic similar to that included in CPLDs such as those available from Xilinx, Inc. Exemplary CPLD configuration is described in pages 5-16 and 5-17 of the Xilinx 1999 Data Book, which pages are incorporated herein by reference.

In other embodiments, the configuration memory cells (however implemented) are configured by a device not included in the MCM. For example, the configuration data and configuration control signals can be provided by a source (e.g., a microprocessor) external to the MCM.

Figure 8:
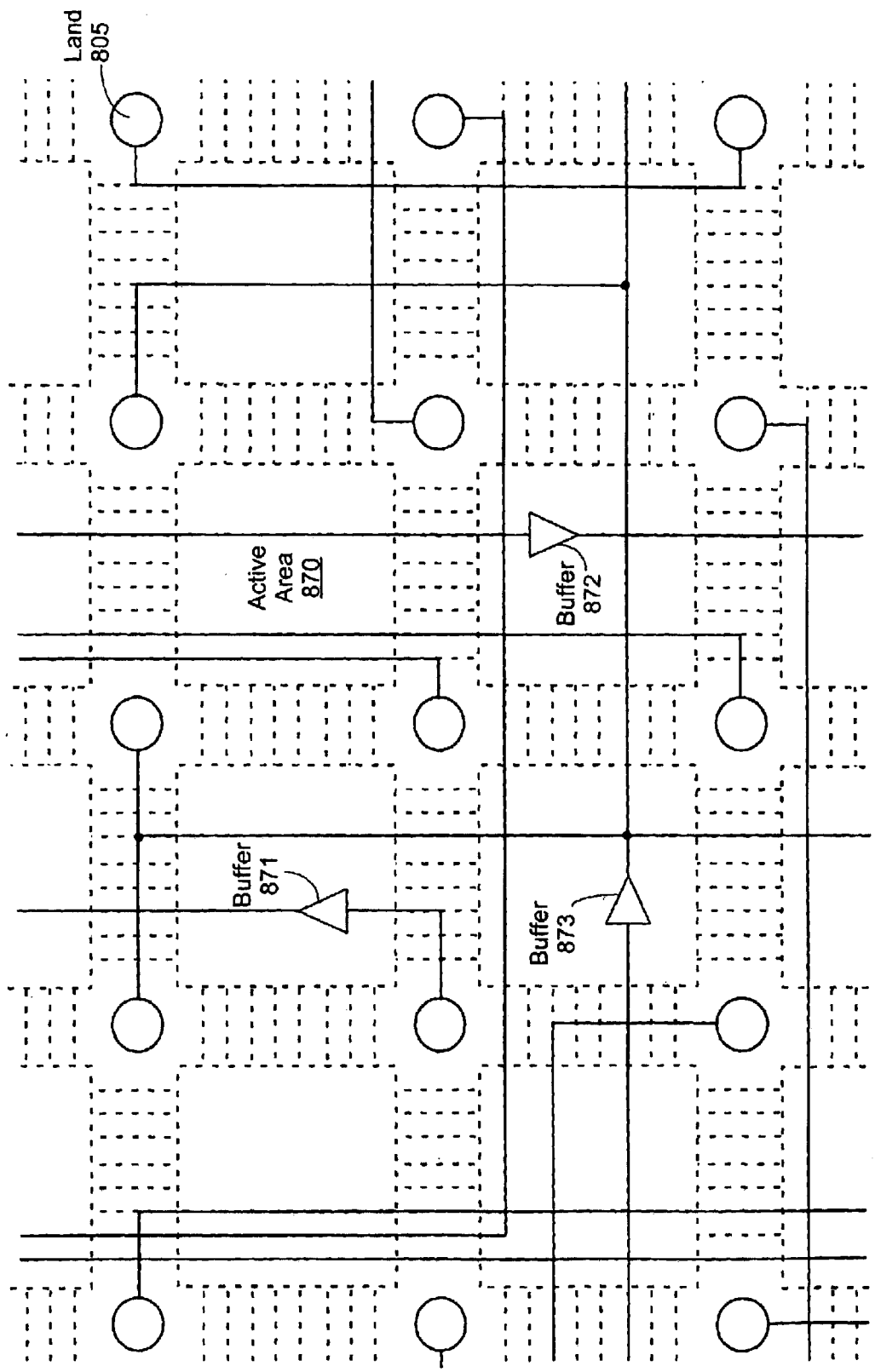
FIG. 8 illustrates an active MCM substrate with a fixed interconnect structure, according to an embodiment of the invention.

FIG. 8 illustrates an active substrate according another embodiment of the invention, where the active substrate of the MCM is not programmable. The pictured substrate includes active areas 870 and lands 805, which are interconnected by a non-programmable interconnect structure. In some embodiments (not shown), the active areas and the interconnect structure overlap. At least some of the active areas include transistors embedded within the active substrate. In the embodiment of FIG. 8, some of the active areas include buffers 871–873. Because the substrate is "full-custom", i.e., designed specifically for each MCM design, the buffers can be added only where they are known to be required.

Figure 9:
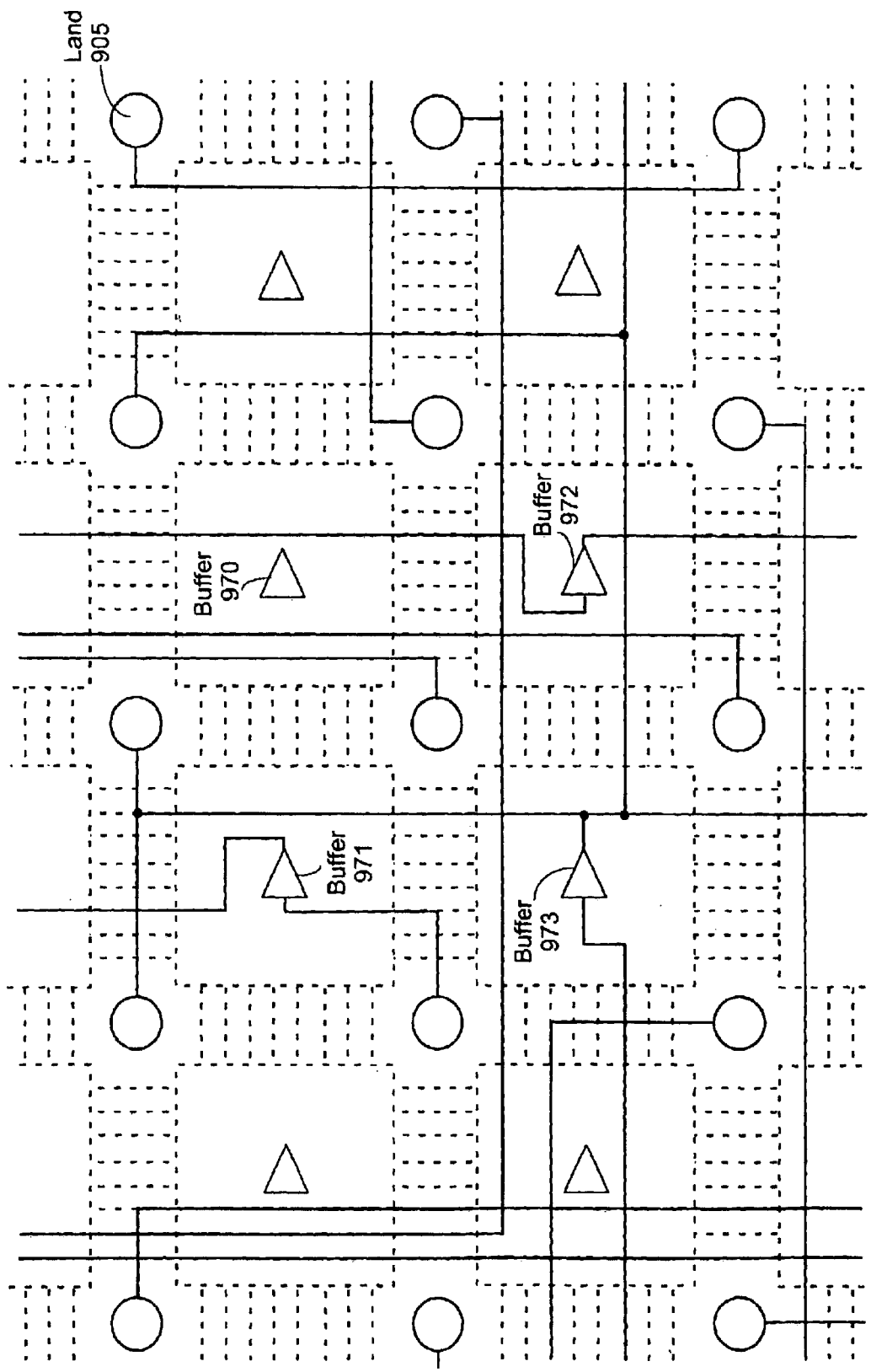
FIG. 9 illustrates an active MCM substrate with a mask-programmable interconnect structure, according to an embodiment of the invention.

FIG. 9 illustrates an active substrate according to yet another embodiment, where the active substrate is mask-programmable. In the embodiment of FIG. 9, each active area includes the same logic. Thus, the surface of the active substrate includes a regular array of lands interspersed with a regular array of active areas including transistors, in a fashion similar to an Application Specific Integrated Circuit (ASIC), or gate array. Thus, after the interconnect needs of the MCM are known, one or more metal layers (two layers, in the embodiment of FIG. 9) are applied to the surface of the active substrate. Where the logic gates are needed, the metal layers are laid down to make contact with the input and output terminals of the logic gates, e.g., buffers 971–973 in FIG. 9. Where the logic gates are not needed, the metal layers are laid down to avoid contact with the input and output terminals of the logic gates, e.g., buffer 970.

An advantage of the invention that has not yet been described is the fact that interconnect features on the active substrate (e.g., transistors) can be implemented using larger features sizes than are conventionally used in integrated circuits. Larger feature sizes can significantly improve the yield and thus reduce the cost of a product, because a small defect does not necessarily incapacitate a large transistor. The lithographic techniques used for thin film transistor displays can be used to manufacture these larger transistors over the required area of the active substrate.

Those having skill in the relevant arts of the invention will now perceive various modifications and additions that can be made as a result of the disclosure herein. Accordingly, all such modifications and additions are deemed to be within the scope of the invention, which is to be limited only by the appended claims and their equivalents.

What is claimed is:

1. A multi-chip module (MCM), comprising:
   an active substrate comprising:
      a plurality of lands disposed upon a first surface thereof, a first subset of the lands being external lands,
      a programmable interconnect structure comprising a plurality of interconnect lines and a plurality of programmable interconnect points (PIPs) coupled to the interconnect lines, a plurality of the interconnect lines being programmably connectable to the lands through a plurality of the PIPS, and
      a plurality of configuration memory cells, each configuration memory cell being coupled to one of the PIPs;
   a first integrated circuit (IC) die having a plurality of IC terminals disposed upon a first surface thereof, the IC terminals of the first IC die being directly coupled to a second subset of the lands; and
   a second IC die having a plurality of IC terminals disposed upon a first surface thereof, the IC terminals of the second IC die being directly coupled to a third subset of the lands.

2. The MCM of claim 1, wherein the plurality of lands are arranged in a regular grid pattern.

3. The MCM of claim 2, wherein the first and second IC dice have different footprints.

4. The MCM of claim 1, wherein the configuration memory cells comprise static RAM cells and the substrate further comprises configuration logic non-programmably coupled to the static RAM cells.

5. The MCM of claim 4, wherein one of the first and second IC dice comprises a programmable read only memory (PROM) die having a plurality of PROM terminals non-programmably coupled to the configuration logic through the third subset of the lands, the PROM die comprising configuration data for the programmable interconnect structure.

6. The MCM of claim 1, wherein the configuration memory cells comprise EPROM-based cells.

7. The MCM of claim 1, wherein at least one of the PIPs is buffered.

8. The MCM of claim 1, wherein the IC terminals of the first and second IC dice comprise one of a group of terminal types including solder bumps and stub terminals.

9. The MCM of claim 1, wherein the lands and the IC terminals of the first and second IC dice comprise protrusions and recesses of complementary shapes.

10. The MCM of claim 1, wherein:
    the IC terminals of the first and second IC dice each include a power terminal and a ground terminal; and
    the active substrate further comprises a power land directly coupled to each of the power terminals, a first fixed interconnect line coupled between the power land and a first selected one of the external lands, a ground land directly coupled to each of the ground terminals, and a second fixed interconnect line coupled between the ground land and a second selected one of the external lands.

11. The MCM of claim 10, wherein:
    the active substrate further comprises an additional power land coupled to the first fixed interconnect line and an additional ground land coupled to the second fixed interconnect line; and the MCM further comprises a capacitor device coupled between the additional power land and the additional ground land.

12. The MCM of claim 1, wherein:
the IC terminals of the first IC die include a power terminal; and
the active substrate further comprises a programmable voltage regulator coupled to the power terminal of the first IC die.

13. The MCM of claim 1, further comprising a package having a plurality of package pins, and wherein the first subset of the lands are coupled to selected ones of the package pins.

14. A multi-chip module (MCM), comprising:
an active substrate comprising:
  a plurality of lands disposed upon a first surface thereof, a first subset of the lands being external lands,
  an interconnect structure coupled to at least a portion of the lands and comprising a plurality of fixed interconnect lines, and
  a plurality of active areas including transistors embedded within the active substrate, the active areas being coupled to the interconnect structure;
a first integrated circuit (IC) die having a plurality of IC terminals disposed upon a first surface thereof, the IC terminals being directly coupled to a second subset of the lands; and
a second IC die having a plurality of IC terminals disposed upon a first surface thereof, the IC terminals being directly coupled to a third subset of the lands.

15. The MCM of claim 14, wherein the plurality of lands are arranged in a regular grid pattern.

16. The MCM of claim 15, wherein the first and second IC dice have different footprints.

17. The MCM of claim 14, wherein at least one of the active areas comprises buffers, each buffer being coupled between two of the interconnect lines.

18. The MCM of claim 14, wherein the IC terminals of the first and second IC dice comprise one of a group of terminal types including solder bumps and stub terminals.

19. The MCM of claim 14, wherein the lands and the IC terminals of the first and second IC dice comprise protrusions and recesses of complementary shapes.

20. The MCM of claim 14, wherein:
the IC terminals of the first and second IC dice each include a power terminal and a ground terminal; and
the active substrate further comprises a power land directly coupled to each of the power terminals, a first fixed interconnect line coupled between the power land and a first selected one of the external lands, a ground land directly coupled to each of the ground terminals, and a second fixed interconnect line coupled between the ground land and a second selected one of the external lands.

21. The MCM of claim 20, wherein:
the active substrate further comprises an additional power land coupled to the first fixed interconnect line and an additional ground land coupled to the second fixed interconnect line; and
the MCM further comprises a capacitor device coupled between the additional power land and the additional ground land.

22. The MCM of claim 14, wherein:
the active substrate further comprises a power interconnect line and a first power land;
the IC terminals of the first IC die include a first power terminal coupled to the first power land; and
at least one of the active areas comprises a level shifter coupled between the power interconnect line and the first power land.

23. The MCM of claim 14, wherein:
the IC terminals of the first IC die include a power terminal; and
the active substrate further comprises a programmable voltage regulator coupled to the power terminal of the first IC die.

24. The MCM of claim 14, further comprising a package having a plurality of package pins, and wherein the first subset of the lands are coupled to selected ones of the package pins.

25. A multi-chip module (MCM), comprising:
a mask-programmable active substrate comprising:
  a plurality of lands disposed in a first regular grid pattern upon a first surface of the active substrate, a first subset of the lands being external lands,
  a mask-programmable interconnect structure coupled to at least a portion of the lands and comprising a plurality of mask-programmed interconnect lines, and
  a plurality of active areas distributed in a second regular grid pattern corresponding to the first regular grid pattern, each active area including similar transistors embedded within the active substrate, at least one of the active areas being mask-programmably coupled to the interconnect structure;
a first integrated circuit (IC) die having a plurality of IC terminals disposed upon a first surface thereof, the IC terminals being directly coupled to a second subset of the lands; and
a second IC die having a plurality of IC terminals disposed upon a first surface thereof, the IC terminals being directly coupled to a third subset of the lands.

26. The MCM of claim 25, wherein the first IC die and the second IC die have different footprints.

27. The MCM of claim 25, wherein each of the active areas comprises a buffer.

28. The MCM of claim 25, wherein the IC terminals of the first and second IC dice comprise one of a group of terminal types including solder bumps and stub terminals.

29. The MCM of claim 25, wherein the lands and the IC terminals of the first and second IC dice comprise protrusions and recesses of complementary shapes.

30. The MCM of claim 25, wherein:
the IC terminals of the first and second IC dice each include a power terminal and a ground terminal;
the plurality of lands comprises first and second power lands directly coupled to the power terminal of each of the first and second IC dice and first and second ground lands directly coupled to the ground terminal of each of the first and second IC dice;
the interconnect structure further comprises a first fixed interconnect line coupled to the first and second power lands and a second fixed interconnect line coupled to the first and second ground lands;
the first fixed interconnect line is further coupled to a first selected one of the external lands; and
the second fixed interconnect line is further coupled to a second selected one of the external lands.

31. The MCM of claim 30, wherein:
the active substrate further comprises a third power land coupled to the first fixed interconnect line and a third ground land coupled to the second fixed interconnect line; and the MCM further comprises a capacitor device coupled between the third power land and the third ground land.

32. The MCM of claim 25, wherein:

the IC terminals of the first IC die include a power terminal; and the active substrate further comprises a programmable voltage regulator coupled to the power terminal of the first IC die.

33. The MCM of claim 25, further comprising a package having a plurality of package pins, and wherein the first subset of the lands are coupled to selected ones of the package pins.

\* \* \* \* \*